United States Patent [19]

Bledsoe

[11] Patent Number: 6,072,355
[45] Date of Patent: Jun. 6, 2000

[54] BOOTSTRAPPED CMOS SAMPLE AND HOLD CIRCUITRY AND METHOD

[75] Inventor: Jerry L. Bledsoe, Tucson, Ariz.

[73] Assignee: Burr-Brown Corporation, Tucson, Ariz.

[21] Appl. No.: 09/010,875

[22] Filed: Jan. 22, 1998

[51] Int. Cl.[7] .......................... H03K 17/687; H03K 17/16
[52] U.S. Cl. ........................... 327/390; 327/589; 327/94; 341/122; 341/156; 326/88
[58] Field of Search ................................... 327/390, 589, 327/94, 124, 403, 404, 434, 437, 91, 92, 93; 341/110, 122, 126, 156; 326/88, 92

[56] References Cited

U.S. PATENT DOCUMENTS

| | | | |
|---|---|---|---|
| 3,659,117 | 4/1972 | Caveney et al. | 327/321 |
| 3,875,516 | 4/1975 | Thomas | 327/14 |
| 4,284,905 | 8/1981 | Rosenzweig | 326/88 |
| 4,308,468 | 12/1981 | Olson | 327/94 |
| 5,084,634 | 1/1992 | Gorecki | 327/91 |
| 5,130,571 | 7/1992 | Carroll | 327/94 |
| 5,172,019 | 12/1992 | Naylor et al. | 327/390 |
| 5,313,113 | 5/1994 | Linder | 327/92 |
| 5,315,169 | 5/1994 | Linder et al. | 327/92 |
| 5,378,938 | 1/1995 | Birdsall et al. | 327/94 |
| 5,384,570 | 1/1995 | Dedic | 341/172 |
| 5,500,612 | 3/1996 | Sauer | 327/91 |
| 5,514,994 | 5/1996 | Sawada | 327/390 |
| 5,543,750 | 8/1996 | Oh | 327/589 |
| 5,831,469 | 11/1998 | Menichelli | 327/536 |

OTHER PUBLICATIONS

"A 16b SD Pipeline ADC with 2.5 MHz Output Date–Rate", by Todd L. Brooks, David H. Robertson, Daniel F. Kelly, Anthony Del Muro, and Steve W. Harston, Oversampling Data Converters, ISSCC97, Session 13, Paper FP 13.1.

"Video–Rate Analog–to–Digital Conversion Using Pipelined Architectures", by Stephen N. Lewis, Memorandum No. UCB/ERL M87/90, Nov. 18, 1987, pp. 71–76.

"A Pipelined 5–Msample/s 9–bit Analog–to–Digital Converter", by Stephen H. Lewis and Paul R. Gray, IEEE J. Solid–State Circuits, vol. SC–22, No. 6, pp. 954–961, Dec. 1987.

Primary Examiner—Timothy P. Callahan
Assistant Examiner—Terry L. Englund
Attorney, Agent, or Firm—Cahill, Sutton & Thomas P.L.C.

[57] ABSTRACT

A bootstrap sample and hold circuit accurately acquires and holds values of a high frequency analog input signal, to avoid harmonic distortion of a signal representing the analog input signal in, for example, a pipeline ADC, includes a first sampling MOSFET coupling the analog input signal to a sampling capacitor. A bootstrap circuit includes a bootstrap capacitor. First and second MOSFETs couple the bootstrap capacitor between a first reference voltage and ground in response to pulses of a first clock signal. Third and fourth MOSFETs then couple the bootstrap capacitor between the gate and source of the sampling MOSFET in response to non-overlapping pulses of a second clock signal to apply a constant gate-to-source voltage to the sampling MOSFET, the gate-to-source voltage having a magnitude equal to the difference between a first reference voltage and ground during the pulses of the second clock signal.

23 Claims, 6 Drawing Sheets

BOOTSTRAPPED CMOS SAMPLE AND HOLD CIRCUITRY AND METHOD

BACKGROUND OF THE INVENTION

The invention generally relates to MOS bootstrap circuits, and more particularly to MOS sample and hold circuits utilizing bootstrap circuitry, and still more particularly to pipeline analog-to-digital converters (ADCs) utilizing sample and hold circuits including MOS bootstrap circuitry.

CMOS sample and hold (S/H) circuits have been long used in pipeline analog-to-digital converters. See "A Pipeline 5-M sample/s 9-bit Analog-to-Digital Converter" by Steven H. Lewis and Paul R. Gray, IEEE J. Solid State Circuits, vol. SC-22, no. 6, pages 954–961, December 1987. Also see pages 542 and 543 of "Analog-digital conversion handbook", 1986, by Analog Devices, Inc., for a discussion of harmonic distortion of digital-to-analog converters. Also see the doctoral dissertation entitled "Video-Rate Analog-to-Digital Conversion Using Pipelined Architecture", dated Nov. 18, 1987, and related Memorandum No. UCB/ERL M87/90 therein by Stephen H. Lewis.

Pipeline ADCs are the type of ADC most commonly used for converting high frequency input signals to digital numbers. FIG. 1 shows a block diagram of a prior art 12-bit pipeline ADC architecture. Pipeline ADC 30 includes 11 identical or similar stages 30-1,2 . . . 11. The first stage 30-1 receives a differential high frequency input signal $v_{in}$ applied between the inputs of a differential sample and hold circuit 31-1. In the prior art, the differential input signal $v_{in}$ may be a signal varying from DC to only about 5 to 10 megahertz. Stages 30-2,3 . . . 10 of pipeline analog-to-digital converter 30 each include a DC sample and hold (S/H) circuit 31-2 . . . 10. Such S/H circuits are conventional. Each receives a differential DC error voltage from the previous stage. Note that only the input S/H circuit 31-1 has to acquire an AC signal. The remaining S/H circuits 31-2,3 . . . 10 simply acquire and hold the DC error voltages from the previous stages, respectively. The conventional input S/H circuit 31-1 in FIG. 1 limits the speed and linearity of the prior art pipeline ADC shown in FIG. 1.

Each stage of pipeline ADC 30 of FIG. 1 includes a 2-bit flash ADC (analog-to-digital converter) and a 2-bit DAC (digital-to-analog converter), and operates by successively performing "coarse" analog-to-digital conversion of the analog error terms produced by the successively preceding stages to generate successively less significant output bits B2–B12, respectively. Differential architectures usually have been used in the S/H circuits because they convert offset errors, charge injection errors, etc., to common mode signals which are inherently cancelled out by the differential amplifiers therein. As described in numerous publications by Professor Paul Gray and various students of the University of California at Berkeley over the past twenty or more years, pipeline ADCs have the advantage that non-critical circuit components can be used to form an analog-to-digital converter with very good resolution and very high accuracy. Recent literature has discussed development of high speed pipeline ADCs in the 10 to 16-bit range. At the current state of the art, attempts are being made to produce pipeline ADCs that can convert analog input signals of frequencies of higher than 20 megahertz to digital numbers with sufficiently good accuracy and resolution to be useful for very high speed applications.

To this end, it is important that the input S/H circuit 31-1 of prior art FIG. 1 be improved to have wider bandwidth so as to be able to accurately acquire and hold such high frequency analog input signals. (As a rule of thumb, the bandwidth of a high speed S/H circuit should be at least twenty times the clock frequency. It usually is desirable to obtain 0.1 LSB accuracy. The required number of time constants $\tau$ is given by $\ln(2^N)$, where N is the number of bits of the ADC. Therefore, the total time $(\ln(2^N))*\tau$ is ½ $f_{CLK}$ if only half of the clock cycle is available for obtaining the 0.1 LSB accuracy. For N equal to 12 bits, $\ln(2^N)$=10.6, so $\tau \approx 20 \cdot f_{CLK}$ is the sampling clock frequency.) While the S/H circuit 31-1 is holding the acquired (sampled) input signal, the second S/H circuit 31-2 is acquiring it, in a time-interleaved process controlled by two non-overlapping clock signals.

FIG. 2A shows a common differential S/H circuit 31, in which an analog input signal $v_{in}$ is applied between a (+) input terminal 41A and a (−) input terminal 41B, which are coupled by switches 42A and 42B to conductors 43A and 43B, respectively. Switches 42A and 42B are controlled by a clock signal φ1. Conductors 43A and 43B are connected to the "bottom" plates of sampling capacitors CS1 and CS2, respectively. A switch 44, controlled by a second clock phase φ2, is coupled between conductors 43A and 43B. As shown in FIG. 2B, φ1 and φ2 are non-overlapping clock signals which are derived from a main sampling clock signal CLK. The trailing edges of signals φ1A and φ1B are also shown in FIG. 2B. The "top" plates of sampling capacitors $C_{S1}$ and $C_{S2}$ are coupled by conductors 45A and 45B to the (+) and (−) inputs of an operational amplifier 47, which has an inverted output on conductor 51A and a non-inverted output on conductor 51B. A DC output signal $V_{OUT}$ appears between conductors 51A and 51B. A switch 46, controlled by a slightly delayed clock signal φ1A, is connected between conductors 45A and 45B.

A sampling capacitor $C_{S3}$ is coupled between conductor 45A and conductor 49A. Similarly, a sampling capacitor $C_{S4}$ is coupled between conductors 45B and 49B. Switches 48A and 48B, controlled by a delayed clock signal φ1B, are coupled between a bias voltage $V_{B1}$ and conductors 45A and 45B, respectively. Conductors 49A and 49B are coupled by switches 50A and 50B, controlled by φ1, to a common mode voltage $V_{CM}$. Conductors 49A and 49B also are connected by switches 52A and 52B, controlled by φ2, to output conductors 51A and 51B, respectively. During φ2, operational amplifier 47 is connected as a feedback amplifier, with switches 52A and 52B closed; switches 42A, 42B, 50A, 50B, 48A, and 48B also are open. Switch 44 is closed and switch 46 is open, so that the sampled charge on the series connection of $C_{S1}$ and $C_{S2}$ is redistributed onto sampling capacitors CS3 and CS4, respectively. $v_{in}$ is acquired or stored on the series connection of sampling capacitors $C_{S1}$ and $C_{S2}$ when switches 42A, 42B, and 46 are closed and switch 44 is open.

The differential S/H circuit shown in FIG. 2A is known by those skilled in the art to avoid clock feedthrough problems by "bottom plate switching" wherein switches 48A and 48B open first to remove the DC bias voltage $V_{B1}$ from conductors 45A and 45B. Then switches 46, 42A, and 42B are opened. This results in very little charge injection into the bottom plate conductors 45A and 45B. After switches 48A and 48B are opened, switch 46 is opened, ending the acquisition mode. Finally, switches 42A and 42B are opened to remove the input signal from the top plates of sampling capacitors CS1 and CS2. This technique, known as bottom plate switching, results in minimal charge being injected into the top plates of the sampling capacitors.

All of the switches usually are implemented using MOS transistors. Switches 42A and 42B typically each are CMOS transmission gates. Therefore, if $v_{in}$ is a high frequency signal, the above mentioned problems caused by the nonlinear channel resistance of the sampling MOSFET switches 42A and 42B can produce inaccuracy in the sampled DC output voltage $V_{OUT}$. Such inaccuracy generally cannot be compensated for later in a utilization circuit (such as a pipeline ADC).

To understand the bandwidth limitations of the above described prior art circuit of FIG. 2A, it may be helpful to refer to FIG. 2C, wherein a typical MOS S/H circuit of the type generally used in the circuits of FIGS. 1 and 2A includes a "sampling MOSFET" 35 coupled by its source and drain between an AC analog input signal $v_{in}$ and a "sampling capacitor" $C_S$. The gate electrode of sampling MOSFET 35 receives a control signal $V_{SAMPLE}$ that is at a constant "1" level during an "acquire" or "sample" mode during which the voltage across the sampling capacitor $C_S$ follows or tracks the AC input signal $v_{in}$. (The terms "sampling", "acquiring", and "tracking" as used herein all have essentially the same meaning.) When $V_{SAMPLE}$ undergoes a transition from a "1" or "acquire" level to a "0" or "hold" level, sampling MOSFET 35 is turned off. Thereafter, the voltage across sampling capacitor $C_S$ has a DC value nearly equal to the value of $v_{in}$ at the instant sampling MOSFET 35 was turned off.

During the "acquire" operation sampling MOSFET 35 is on, and therefore can be represented as a variable resistor having a channel resistance $r_{on}$. $r_{on}$ is a strong function of the gate-to-source voltage of sampling MOSFET 35. The variation in $r_{on}$ causes a corresponding inverse variation in the bandwidth of the S/H circuit, which in turn results in substantial inaccuracies in the acquisition of the acquired values of $v_{in}$ if the sampling frequency is high, especially above 5–10 MHz. Therefore, at any high frequency of $v_{in}$, the analog input signal $v_{in}$ never is perfectly acquired by sampling capacitor $C_S$. The accuracy with which $v_{in}$ is acquired on sampling capacitor $C_S$ actually is a nonlinear function of $v_{in}$, because of the nonlinearity of $r_{on}$ as a function of $v_{in}$.

Consequently, if the S/H circuit is at the "front end" of a pipeline ADC, the variations in $r_{on}$ as a function of $v_{in}$ cause uncorrectable harmonic distortion in the digital output signal produced by the pipeline ADC.

In the prior art, one approach to avoiding such nonlinearity of the channel resistance $r_{on}$ of sampling MOSFET 35 as a function of $v_{in}$ is to make MOSFET 35 very large, so its $r_{on}$ is negligible. That approach has been suitable for pipeline ADCs which sample $v_{in}$ at no more than a 5 to 10 megahertz rate. The low bandwidth of the S/H circuit prevents accurate sampling of $v_{in}$ at higher frequencies. Other approaches are described in commonly assigned U.S. Pat. No. 5,172,019 entitled "Bootstrapped FET Sampling Switch" by Naylor et al. and commonly assigned U.S. Pat. No. 5,084,634 "Dynamic Input Sampling Switch for CDACs" by Gorecki. However, the bootstrapped circuits disclosed in these reference are unduly complex. They require supply voltages much greater than the input signals. Typically, these circuits operate from +15 volt and −15 volt power supplies with 5–10 volt input signals, and therefore have ample "head room" between the maximum amplitude input signal and the positive power supply level. Those skilled in the art know that this "head room" greatly simplifies the circuit design. For ADCs which are designed to operate from a single 5 volt power supply, there is no such ample "head room", and it is a major challenge to obtain the desired combination of adequate output signal levels, high circuit speed, low power dissipation, and simple circuit configurations that require relatively little chip area.

Various "bootstrap" circuits have been widely utilized since the early days of MOS technology, wherein a capacitor connected between the gate electrode and drain electrode of an MOS transistor is charged to provide an electrically "floating" gate voltage that differs from the source voltage by a constant voltage stored across the bootstrap capacitor. This results in a constant gate-to-source voltage being applied to the MOS transistor, irrespective of the source voltage. The constant gate-to-source voltage results in relatively constant channel resistance.

SUMMARY OF THE INVENTION

Accordingly, it is an object of the invention to provide an accurate MOS sample and hold circuit to avoid harmonic distortion in a utilization circuit coupled to an output of the sample and hold circuit.

It is another object of the invention to provide a sample and hold circuit wherein the channel resistance of a sampling MOSFET is substantially independent of the analog input signal being sampled and held.

It is another object of the invention to provide an MOS sample and hold circuit and technique which provides high bandwidth and very linear channel resistance in a sampling MOSFET thereof.

It is another object of the invention to provide an improved pipeline ADC with low harmonic distortion at high input sampling rates of approximately 20 megahertz or higher.

Briefly described, and in accordance with one embodiment thereof, the invention provides a bootstrap sample and hold circuit for accurately acquiring and holding values of a high frequency analog input signal for use by a utilization circuit to avoid harmonic distortion of a signal representing the analog input signal in the utilization circuit includes a first sampling MOSFET (3) coupled between a first conductor (41) conducting a high frequency analog input signal and a second conductor (43), a sampling capacitor (4) coupled between the second conductor (43) and a first reference voltage (45), a utilization circuit having an input conductor coupled to the second conductor for performing a predetermined signal processing operation on successive values of the analog input signal held on the sampling capacitor, and a first bootstrap circuit (7) including a first bootstrap capacitor (C2) coupled between third (20) and fourth (21) conductors, a first MOSFET (28) coupled between a second reference voltage (+$V_{CAP}$) and the third conductor (20), and a second MOSFET (29) coupled between a third reference voltage (GND) and the fourth conductor (21), the first and second MOSFETs being turned on in response to pulses of a first clock signal ($\phi 2$), and a third MOSFET (25) coupled between the third conductor (20) and a gate of the first sampling MOSFET (3), and a fourth MOSFET (22) coupled between the fourth conductor (21) and the first conductor (41), the third and fourth MOSFETs being turned on by pulses of a second clock signal ($\phi 1$) which are non-overlapping with the pulses of the first clock signal, to apply a constant gate-to-source voltage to the sampling MOSFET (3), the gate-to-source voltage having a magnitude equal to the difference between the second reference voltage and the third reference voltage during the pulses of the second clock signal ($\phi 1$). In the described embodiments, the utilization circuit includes a pipeline ADC, the bootstrap sample and hold circuit constituting an input stage for the pipeline ADC.

In another embodiment of the invention a linear channel resistance is produced in a first sampling MOSFET that is switched on and off to repeatedly sample a high frequency analog signal by applying the high frequency analog signal to a source of the first sampling MOSFET wherein first and second bootstrap capacitors both are switchably coupled to the first sampling MOSFET. The first and second bootstrap capacitors are operatively decoupled from the first sampling MOSFET, and then the first bootstrap capacitor is operatively coupled between first and second reference voltage conductors to charge the first bootstrap capacitor to a first voltage, and the second bootstrap capacitor is operatively coupled between third and fourth reference voltage conductors to charge the first bootstrap capacitor to a second voltage. Then the first bootstrap capacitor is operatively decoupled from the first and second reference voltage conductors, and the second bootstrap capacitor is operatively decoupled from the third and fourth reference voltage conductors. Then the first bootstrap capacitor and second bootstrap capacitor are operatively coupled in series between a gate and the source of the first sampling MOSFET to apply a boost voltage between the gate and source of the first sampling MOSFET. The boost voltage represents a summation of the first and second voltages according to the capacitances of the first and second bootstrap capacitors. This produces a constant value of the gate-to-source voltage of the first sampling MOSFET equal to the boost voltage as the voltage of high frequency analog signal varies, to thereby cause the channel resistance to be nearly constant despite voltage changes of the high frequency analog signal.

DETAILED DESCRIPTION OF THE PREFERRED EMBODIMENTS

Figure 2A:
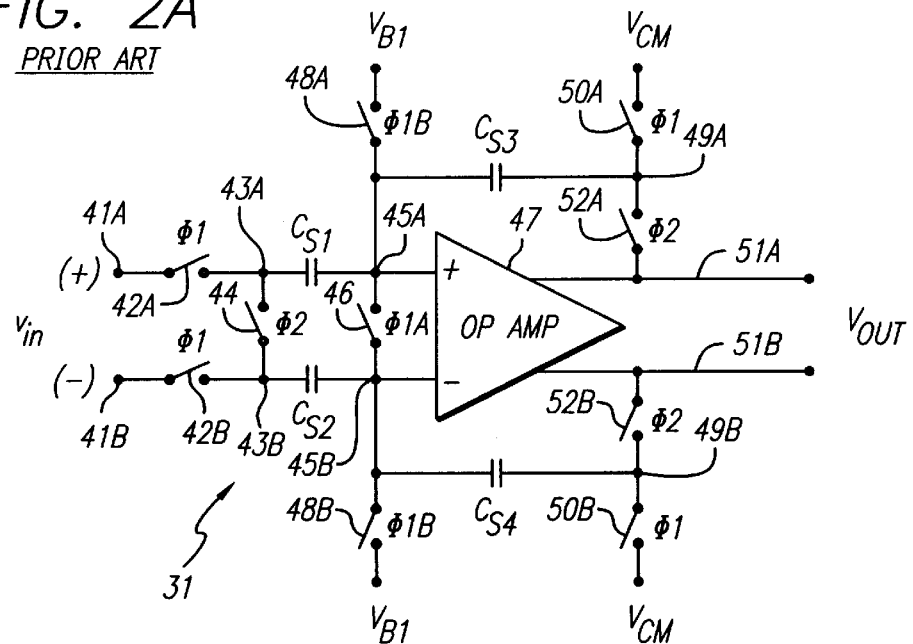
FIG. 2A is a diagram of a conventional differential S/H circuit, wherein the various switches are implemented by MOS or CMOS circuitry.
Figure 3:
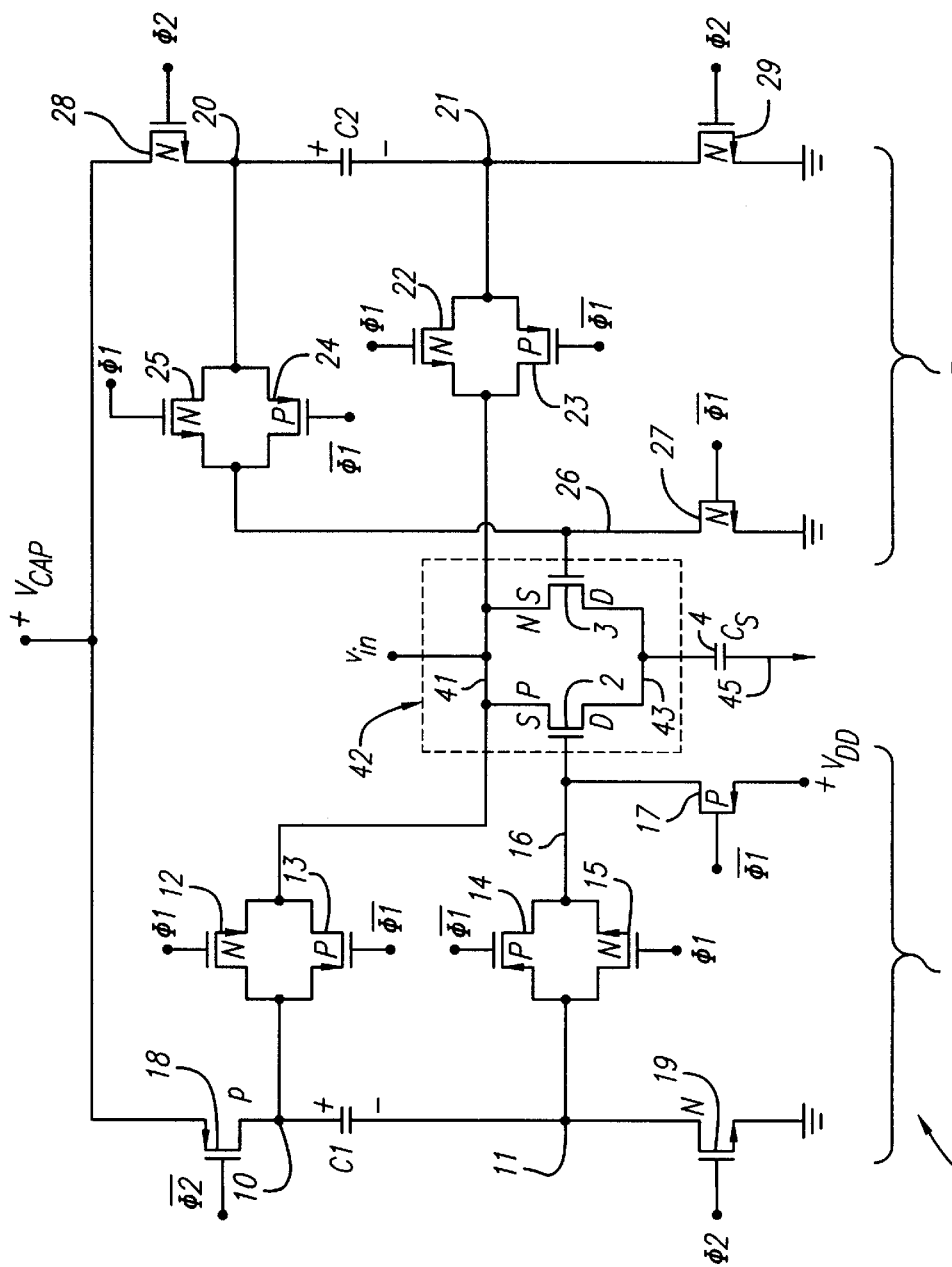
FIG. 3 is a schematic circuit diagram of an MOS bootstrap circuit of the present invention.

Referring to FIG. 3, a bootstrap circuit 1 is shown which is capable of maintaining a constant gate-to-source voltage on both the P-channel MOSFET 2 and the N-channel MOSFET 3 of a CMOS transmission gate designated by numeral 42. CMOS transmission gate 42 could be either of switches 42A and 42B in FIG. 2A. Numeral 4 designates a sampling capacitor $C_S$, which could be either of the sampling capacitors $C_{S1}$ or $C_{S2}$ in above described FIG. 2A.

Bootstrap circuit 1 includes a first bootstrap section 6 which, during the acquire or tracking mode described previously, maintains a constant gate-to-source voltage $V_{CAP}$ on P-channel MOSFET 2. Bootstrap circuit 1 also includes a second bootstrap section 7 which maintains the constant gate-to-source voltage $V_{CAP}$ on N-channel MOSFET 3 of CMOS transmission gate 42.

Figure 2B:
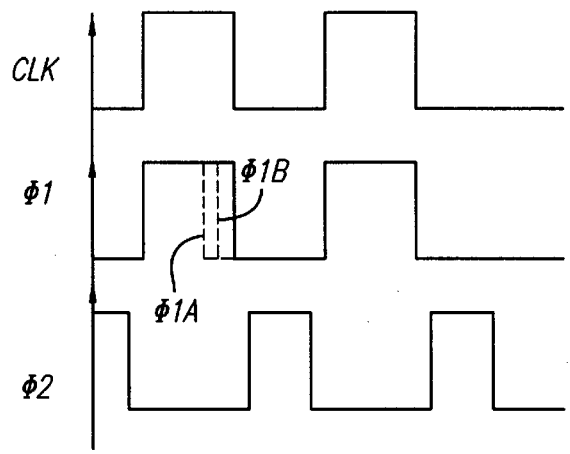
FIG. 2B is a timing diagram useful in describing the operation of the circuit of FIG. 2A.

Bootstrap section 6 includes a P-channel MOSFET 18 having its source connected to $+V_{CAP}$, its gate connected to receive a clock signal $\overline{\phi 2}$, and its drain connected by conductor 10 to one plate of a bootstrap capacitor C1, which can have a capacitance of 10 picofarads. $\overline{\phi 2}$ is the logical complement of the signal $\phi 2$ shown in FIG. 2B. $V_{CAP}$ can be 2.5 volts. The lower plate of capacitor C2 is connected by conductor 11 to the drain of an N-channel MOSFET 19, the gate of which receives $\phi 2$ and the source of which is connected to ground.

Conductor 10 is connected to one terminal of a conventional CMOS transmission gate including N-channel MOSFET 12 and P-channel MOSFET 13. The other terminal of CMOS transmission gate 12,13 is coupled to conductor 41, which receives the signal $v_{in}$. Conductor 41 can be either of input terminals 41A or 41B in FIG. 2A. Conductor 41 is connected to one terminal of CMOS transmission gate 42, the other terminal of which is connected by conductor 43 to one plate of sampling capacitor $C_S$. $C_S$ can be either of sampling capacitors $C_{S1}$ and $C_{S2}$ of FIG. 2A. Conductor 43 can be either of conductors 43A or 43B of FIG. 2A. The lower plate of sampling capacitor $C_S$ is connected to conductor 45, which can be either conductor 45A or 45B of FIG. 2A.

Conductor 11 is connected to one terminal of a CMOS transmission gate including P-channel MOSFET 14 and N-channel MOSFET 15. The other terminal of CMOS transmission gate 14,15 is connected by conductor 16 to the gate of P-channel transmission gate MOSFET 2. Conductor 41 is connected to the source electrodes of P-channel MOSFET 2 and N-channel MOSFET 3. Conductor 16 also is connected to the drain of P-channel MOSFET 17, the source of which is connected to $+V_{DD}$, which can be 5.0 volts. The gate electrodes of N-channel CMOS transmission gate MOSFETs 12 and 15 are connected to $\phi 1$. The gate electrodes of P-channel CMOS transmission gate MOSFETs 13 and 14 are connected to $\overline{\phi 1}$. The gate of P-channel MOSFET 17 also is connected to $\overline{\phi 1}$, $\overline{\phi 1}$ being the logical complement of the clock signal $\phi 1$ shown in FIG. 2B.

The structure of bootstrap section 7 is similar to that of bootstrap section 6, but reverses the polarity of the $V_{CAP}$ voltage applied between the gate and source of N-channel MOSFET 3. The drain of N-channel MOSFET 28 is connected to $+V_{CAP}$, and its source is connected by conductor 20 to the upper plate of bootstrap capacitor C2, which can have a capacitance of 10 picofarads. The gate of MOSFET 28 is connected to $\phi 2$. The lower plate of capacitor C2 is connected by conductor 21 to the drain of N-channel MOSFET 29, the source of which is connected to ground. The gate of MOSFET 29 is connected to $\phi 2$. Conductor 20 is coupled by CMOS transmission gate 24,25 to conductor 26, which is connected to the gate of N-channel MOSFET 3 of transmission gate 42. Conductor 26 also is connected to the drain of N-channel MOSFET 27, the source of which is connected to ground. Conductor 21 is connected to one terminal of CMOS transmission gate 22,23, the other terminal of which is connected by conductor 41 to the source of N-channel MOSFET 3. The gate electrodes of N-channel CMOS transmission gate MOSFETs 25 and 22 are connected to $\phi 1$. The gate electrodes of P-channel CMOS transmission gate MOSFETs 23 and 24 and the gate of N-channel MOSFET 27 are connected to $\overline{\phi 1}$.

Bootstrap capacitors C1 and C2 are initially charged to $+V_{CAP}$ by turning charging MOSFETS 18 and 19 on and turning transmission gate MOSFETS 12, 13, 14, and 15 off during $\phi 2$. MOSFET 17 also is turned on to ensure that MOSFET 2 stays off. Thus, the lower plate of capacitor C1 is at ground and its upper plate is at $+V_{CAP}$, so C1 is charged to $+V_{CAP}$, with the polarity indicated. Similarly, bootstrap circuit 7 turns on charging MOSFETS 28 and 29 and turns off transmission gate MOSFETS 22, 23, 24, and 25 off during $\phi 2$. MOSFET 27 is turned on to ensure that MOSFET 3 stays off. The lower plate of capacitor C2 then is at ground, and its upper plate is at $+V_{CAP}$, so C2 also is charged to $+V_{CAP}$ with the indicated polarity.

Next, charging MOSFETS 18, 19, 28 and 29 are turned off when $\phi 1$ goes from a "1" level to a "0" level. MOSFETS 17 and 27 also are turned off. Then, transmission gate MOSFETS 12, 13, 14, 15, 22, 23, 24, and 25 all are turned on during $\phi 2$, which is the "acquire" or "sample" or "tracking" portion of the sample and hold operation. This connects the upper and lower plates of bootstrap capacitor C1 to the source and gate, respectively, of P-channel MOSFET 2. The gate-to-source voltage of P-channel MOSFET 2 therefore is $-V_{CAP}$, regardless of the value of $v_{in}$. Similarly, the upper and lower plates of bootstrap capacitor C2 are connected to the gate and drain of N-channel MOSFET 3. Therefore, the gate-to-source voltage of N channel MOSFET 3 is $+V_{CAP}$, regardless of the value of $v_{in}$. Consequently, the channel resistances of sampling MOSFETS 2 and 3 are essentially independent of the value of $v_{in}$ and therefore constant, if "body effects" due to the body-to-source reverse bias voltage of such MOSFETs can be neglected. In fact, simple computations show that it is acceptable to neglect the "body effect" on the threshold voltages of the sampling MOSFETs of FIG. 3.

P-channel MOSFET 2 and N-channel MOSFET 3 of transmission gate 42 may have high frequency responses and may be used to sample $v_{in}$ at a rate of roughly 20 MHz or more onto one plate of sampling capacitor $C_S$. The value of $v_{in}$ "acquired" while transmission gate MOSFETs 2 and 3 are on is held on conductor 43 by sampling capacitor $C_S$ as a DC value. The distortion of the input signal $v_{in}$ resulting from the constant channel resistances of input sampling CMOS transmission gate switches of previous sample and hold circuits is avoided. (Note that if the analog input is a DC signal, there is no harmonic distortion due to nonlinearity of the resistance of the sampling MOSFET as a result of its variation with $V_{IN}$. Therefore it would not be helpful to use the above described bootstrap capacity for the input switches of internal sample and hold circuits 31-2,3 . . . 10 of prior art pipeline ADC 30 of FIG. 1.)

Figure 4:
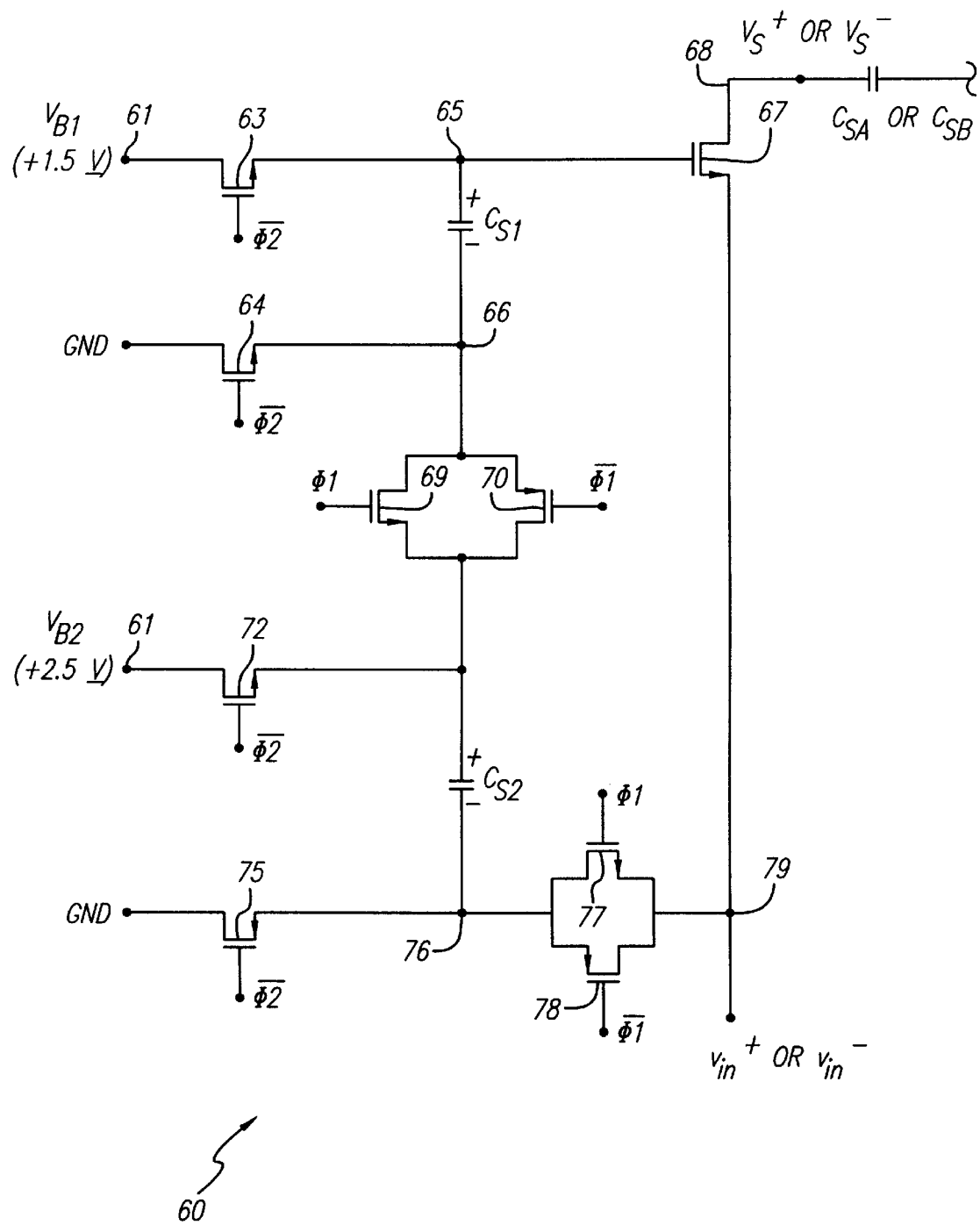
FIG. 4 is a schematic diagram of another MOS bootstrap circuit of the present invention.
Figure 5:
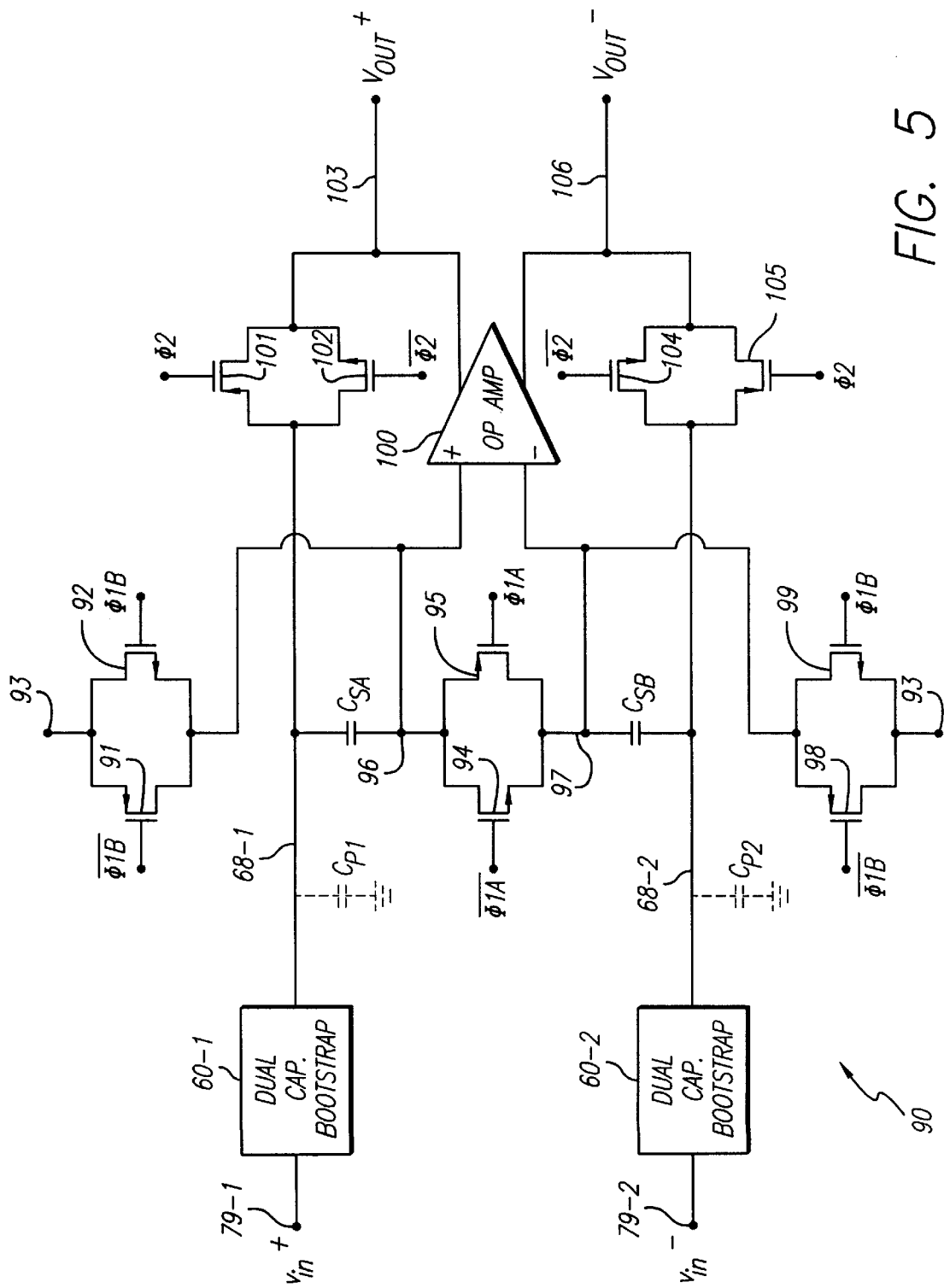
FIG. 5 is a schematic diagram of a S/H circuit using the circuitry of FIG. 4.

FIG. 4 shows another bootstrap circuit that is conceptually similar to the one shown in FIG. 3, for utilization in a S/H circuit 90 shown in FIG. 5 in a pipeline ADC under development by the assignee. Referring to FIG. 4, a first bootstrap capacitor $C_{S1}$, which may have a capacitance of 10 picofarads, is connected between conductors 65 and 66. Conductor 65 is connected to the gate of an N-channel MOSFET sampling switch 67 and to the source of an N-channel MOSFET 63 which is actuated by $\overline{\phi 2}$. The drain of MOSFET 63 is connected by conductor 61 to a +1.5 volt reference voltage $V_{B1}$. Conductor 66 is connected to a CMOS transmission gate including N-channel MOSFET 69 and P-channel MOSFET 70 which are actuated by $\phi 1$ and $\overline{\phi 1}$, respectively, to connect bootstrap capacitor $C_{S1}$ in series with a second bootstrap capacitor $C_{S2}$. Conductor 66 also is coupled to ground by an N-channel MOSFET 64 which is actuated by $\overline{\phi 2}$. Second bootstrap capacitor $C_{S2}$, which may have a capacitance of 10 picofarads, is connected between conductors 73 and 76. Conductor 73 is connected to the other terminal of CMOS transmission gate 69,70, and also is coupled to a +2.5 volt reference voltage $V_{B2}$ by N-channel MOSFET 72; MOSFET 72 is actuated by $\overline{\phi 2}$. Conductor 76 is coupled to ground by N-channel MOSFET 75 when $\overline{\phi 2}$ is at a "1" level, and is coupled by a CMOS transmission gate 77,78 and conductor 79 to the source of sampling MOSFET 67. N-channel MOSFET 77 is actuated by $\phi 1$, and P-channel MOSFET 78 is actuated by $\overline{\phi 1}$.

During $\phi 1$, first bootstrap capacitor $C_{S1}$ is charged to +1.5 volts and second bootstrap capacitor $C_{S2}$ is charged to +2.5 volts (with the indicated polarities), because MOSFETs 63, 64, 72, and 75 are turned on and the CMOS transmission gates 69,70 and 77,78 are turned off. In accordance with the present invention, the bootstrap capacitance, either $C_{S1}$ or $C_{S2}$, can be chosen to have a smaller capacitance than the other bootstrap capacitor, so that the voltage on the conductor 66 does not exceed the positive supply voltage (which is necessary for the "N-well" CMOS process used to fabricate the circuit), while nevertheless increasing the constant gate-to-source voltage of sampling MOSFET 67 to a value substantially greater than the value that can be accomplished by the bootstrap circuit of FIG. 3. Or, the values of one or both of the reference voltages $V_{B1}$ and $V_{B2}$ can be adjusted to accomplish the same result.

Figure 1:
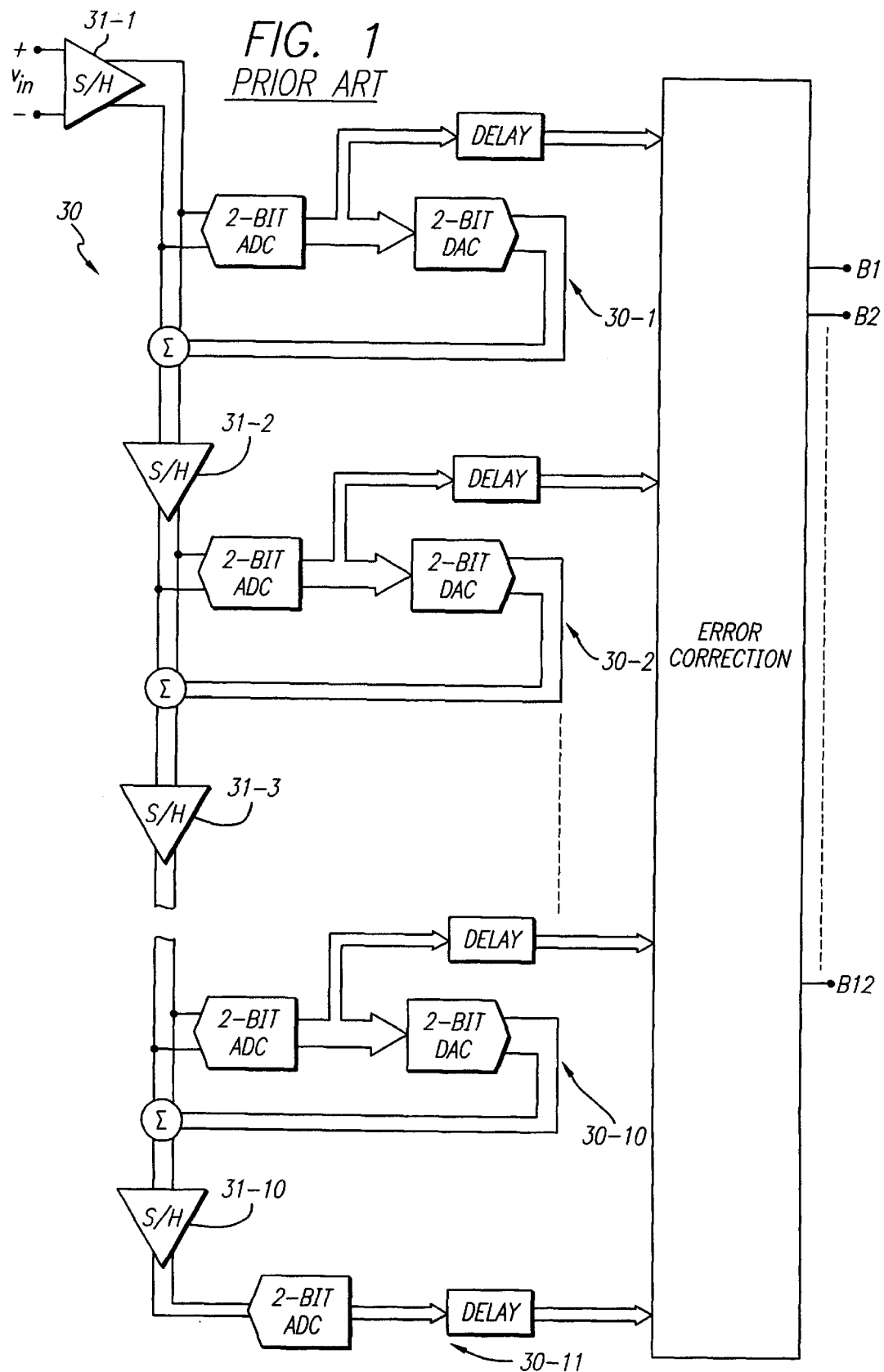
FIG. 1 is a block diagram of a conventional pipeline ADC architecture.

The bootstrap circuit shown in FIG. 4 can be utilized in conjunction with a differential S/H circuit that is basically the same as the circuit of prior art FIG. 1, by providing the two dual capacitor bootstrap circuits 60-1 and 60-2 in the differential S/H circuit 90 of FIG. 5. The differential input signal (i.e., the difference between $v_{in}^+$ and $v_{in}^-$) is applied between conductors 79-1 and 79-2 in FIG. 5. The outputs of the sample switches 67 of dual capacitor bootstrap circuits 60-1 and 60-2 appear on conductors 68-1 and 68-2, respectively. S/H circuit 90 of FIG. 5 includes an operational amplifier 100 which includes two sampling capacitors $C_{SA}$ and $C_{SB}$ in its two feedback loops. Sampling capacitor $C_{SA}$ is connected between conductors 68-1 and 96. Conductor 96 is connected to the upper terminal of CMOS transmission gate 94,95, which is clocked by $\phi 1A$ and $\overline{\phi 1A}$, to the (+) input of operational amplifier 100, and to the lower terminal of CMOS transmission gate 91,92, which is clocked by $\phi 1B$ and $\overline{\phi 1B}$. The upper terminal of CMOS transmission gate 91,92 is connected to a first reference voltage on conductor 93. Conductor 68-1 is connected to the left terminal of CMOS transmission gate 101,102, which is clocked by $\phi 2$ and $\overline{\phi 2}$. The right terminal of CMOS transmission gate 101,102 is connected to conductor 103, on which a DC level $V_{OUT}^+$ is produced by amplifier 100. Similarly, sampling capacitor $C_{SB}$ is connected between conductor 68-2 and conductor 97. Conductor 97 is connected to the lower terminal of CMOS transmission gate 94,95, which is clocked by $\phi 1A$ and $\overline{\phi 1A}$, to the (−) input of operational amplifier 100, and to the upper terminal of CMOS transmission gate 98,99, the lower terminal of which is connected to a second reference voltage on conductor 93. Transmission gate 98,99 is closed by $\phi 1B$ and $\overline{\phi 1B}$. Conductor 68-2 is connected to the left terminal of CMOS transmission gate 104,105, which is clocked by $\phi 2$ and $\overline{\phi 2}$, and to conductor 106 on which a DC level $V_{OUT}^-$ is produced by amplifier 100. Except for the provision of dual capacitor bootstrap circuits 60-1 and 60-2, the structure of FIG. 5 corresponds exactly to the prior art differential sample and hold circuit 31 of FIG. 2A, the operation of which is described earlier herein. The circuit of FIG. 5 was chosen over that of FIG. 2A for a new 14-bit pipeline ADC now being designed because it allows the use of a large sampling capacitor without requiring a proportional increase in the power dissipation of the operational amplifier. (Since the outputs of operational amplifier 100 are coupled to the sampling capacitors CSA and CSB so they are essentially already charged up, the sampling switch MOSFETs 67 only need to fully charge up the smaller parasitic capacitances $C_{p1}$ and $C_{p2}$. This results in substantially more bandwidth, or alternatively, lower power dissipation for the S/H circuit.)

Figure 2C:
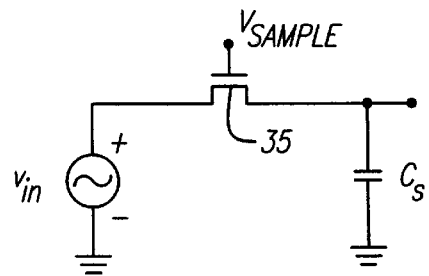
FIG. 2C is a schematic diagram of a simple MOS S/H circuit and is useful in describing the prior art.
Figure 6:
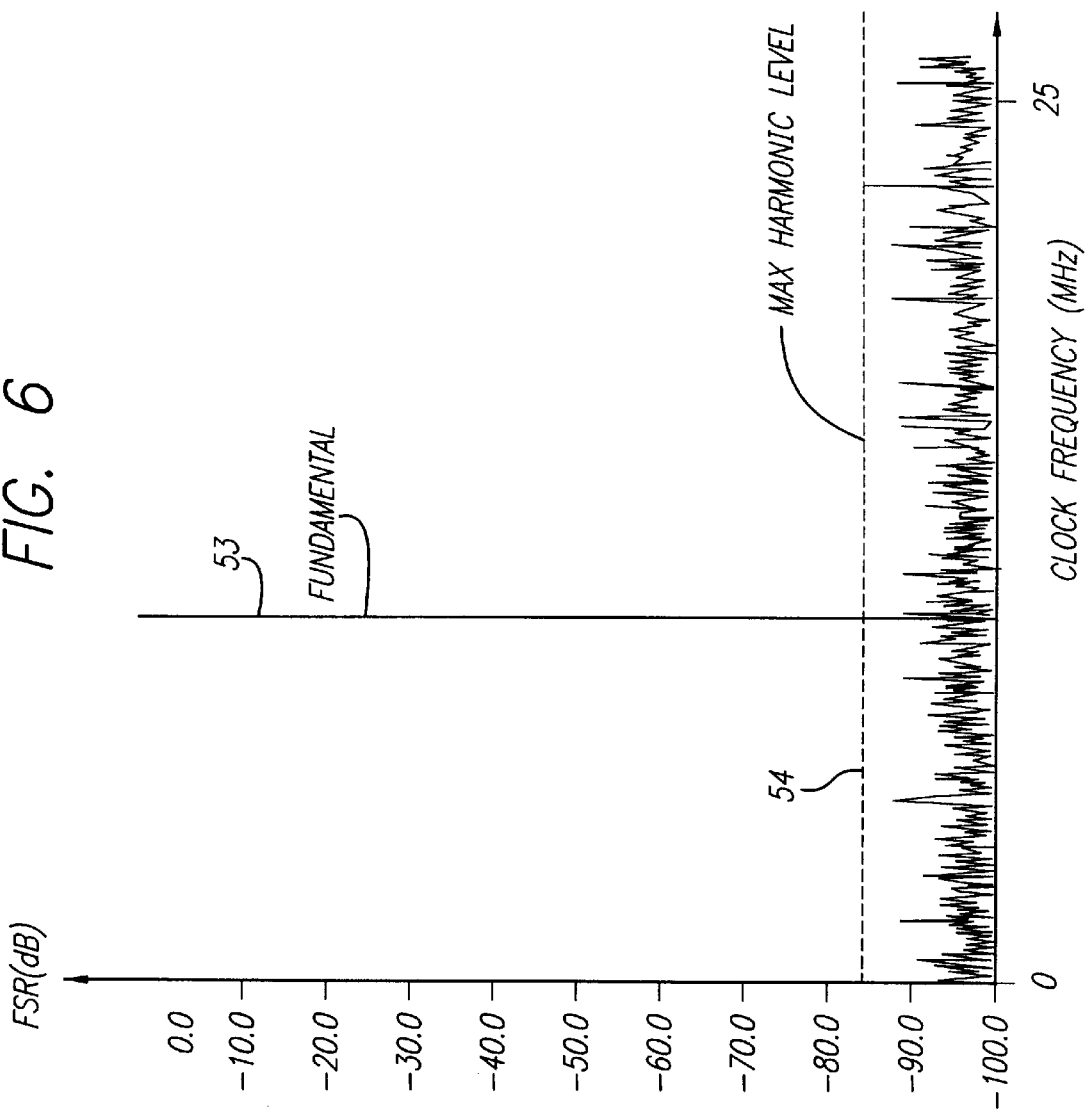
FIG. 6 is a plot of "spurious free dynamic range" for a pipeline ADC as in FIG. 1, modified to use the MOS bootstrap circuit of FIG. 4.

Referring to FIG. 6, the spectral response of a 10-bit implementation of the invention using the bootstrap circuit of FIG. 4 is shown for the front end sample and S/H circuit 30-1 of a 10-bit pipeline ADC having a clock frequency of 60 megahertz. The fundamental component of the spectral response of the digital output signal is designated by numeral 53. The lower-amplitude "spurs" indicating the amplitudes of various noise components and the amplitudes of various harmonics are also illustrated in FIG. 6, with dotted line 54 indicating the maximum amplitude of such components. The "spurious free dynamic range" is represented by the distance between line 54 and the amplitude of the fundamental component 53, and is equal to approximately 82 dB (decibels). This indicates far lower total harmonic distortion than would be achieved if a conventional prior art sampling switch as in FIG. 2C were utilized. For example, a diagram similar to that shown in FIG. 6 for a prior art 10-bit pipeline ADC operating at a clock frequency of 60 megahertz is only about 60 dB.

For present high-speed ADCs, performance and power dissipation both are important factors. Very good performance can be obtained with either bootstrap circuit described herein. However, in order to minimize power dissipation, it is desirable to minimize parasitic capacitances in order to reduce the total power consumption of the circuitry. The dual capacitor bootstrap circuit of FIG. 4 has the advantage of not only providing good dynamic performance, but also reduces parasitic capacitances at conductor 68 by a factor of as much as five compared to those of either the described single bootstrap capacitor circuit or the conventional S/H circuit. Since the parasitic capacitances are quite large (0.2 picofarads in the dual capacitor bootstrap circuit of FIG. 4), the reduction thereof dramatically reduces the power dissipation of a S/H circuit stage.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the portion 7 of the circuit shown in FIG. 3 alone might be used to accurately acquire values of $v_{in}$ on conductor 43 at the desired sampling frequency. The bootstrap circuits described might be used to acquire or sample the stream of pulses output by a CCD (charged coupled device) array. The described sample and hold circuits can be used as an input sample and hold circuit for any kind of ADC, not just a pipeline ADC as described. The described bootstrap circuits might be used to acquire analog input signals or pulses for switched-capacitor active filter circuitry.

What is claimed is:

1. A circuit for accurately acquiring values of a high frequency analog input signal for use by a utilization circuit, comprising in combination:
   (a) a sampling MOSFET coupled between a first conductor conducting the high frequency analog input signal and a second conductor;
   (b) the utilization circuit having an input conductor coupled to the second conductor for performing a predetermined signal processing operation on successive values of the analog input signal coupled by the sampling MOSFET to the second conductor;
   (c) a bootstrap circuit including
      i. a first bootstrap capacitor coupled between third and fourth conductors,
      ii. a first MOSFET coupled between a first reference voltage and the third conductor, and a second MOSFET coupled between a second reference voltage and the fourth conductor, the first and second MOSFETs being turned on in response to pulses of a first clock signal, and
      iii. a third MOSFET coupled between the third conductor and a gate of the sampling MOSFET, and a fourth MOSFET coupled between the fourth conductor and the first conductor, the third and fourth MOSFETs being turned on by pulses of a second clock signal which are non-overlapping with the pulses of the first clock signal, to apply a constant gate-to-source voltage to the sampling MOSFET, the gate-to-source voltage having a magnitude equal to the difference between the first reference voltage and the second reference voltage during the pulses of the second clock signal.

2. A bootstrap sample and hold circuit for accurately acquiring and holding values of a high frequency analog input signal for use by a utilization circuit, comprising in combination:
   (a) a first sampling MOSFET coupled between a first conductor conducting the high frequency analog input signal and a second conductor;
   (b) a sampling capacitor coupled between the second conductor and a first reference voltage and adapted to hold successive values of the analog input signal;
   (c) the utilization circuit having an input conductor coupled to the second conductor for performing a predetermined signal processing operation on the successive values of the analog input signal held on the sampling capacitor;
   (d) a first bootstrap circuit including
      i. a first bootstrap capacitor coupled between third and fourth conductors,
      ii. a first MOSFET coupled between a second reference voltage and the third conductor, and a second MOSFET coupled between a third reference voltage and the fourth conductor, the first and second MOSFETs being turned on in response to pulses of a first clock signal, and
      iii. a third MOSFET coupled between the third conductor and a gate of the first sampling MOSFET, and a fourth MOSFET coupled between the fourth conductor and the first conductor, the third and fourth MOSFETs being turned on by pulses of a second clock signal which are non-overlapping with the pulses of the first clock signal, to apply a constant gate-to-source voltage to the first sampling MOSFET, the gate-to-source voltage having a magnitude equal to the difference between the second reference voltage and the third reference voltage during the pulses of the second clock signal.

3. The bootstrap sample and hold circuit of claim 2 wherein the utilization circuit includes an ADC, the bootstrap sample and hold circuit constituting an input stage for the ADC.

4. The bootstrap sample and hold circuit of claim 3 wherein the ADC is a pipeline ADC.

5. The bootstrap sample and hold circuit of claim 2 wherein the first sampling MOSFET, and the first, second, third, and fourth MOSFETs all are N-channel MOSFETs.

6. The bootstrap sample and hold circuit of claim 5 wherein the first bootstrap circuit further includes a P-channel fifth MOSFET coupled between the third conductor and the gate of the first sampling MOSFET, and a P-channel sixth MOSFET coupled between the fourth conductor and the first conductor, the fifth and sixth MOSFETs being turned on by complements of the pulses of the second clock signal.

7. The bootstrap sample and hold circuit of claim 2 including
a second sampling MOSFET coupled between the first conductor and the second conductor; and
a second bootstrap circuit including
   i. a second bootstrap capacitor coupled between fifth and sixth conductors,
   ii. a fifth MOSFET coupled between the second reference voltage and the fifth conductor, and a sixth MOSFET coupled between the third reference voltage and the sixth conductor, the fifth and sixth MOSFETs being turned on in response to the pulses of the first clock signal, and
   iii. a seventh MOSFET coupled between the fifth conductor and the first conductor, and an eighth MOSFET coupled between the sixth conductor and the gate of the second sampling MOSFET, the seventh and eighth MOSFETs being turned on by pulses of the second clock signal which are non-overlapping with the pulses of the first clock signal, to apply a constant gate-to-source voltage to the second sampling MOSFET, the gate-to-source voltage having a magnitude equal to the difference between the second reference voltage and the third reference voltage during the pulses of the second clock signal.

8. The bootstrap sample and hold circuit of claim 7 wherein the first sampling MOSFET and the first, second, third, and fourth MOSFETs are N-channel MOSFETs and the second sampling MOSFET and the fifth, sixth, seventh, and eighth MOSFETs are P-channel MOSFETs.

9. A high speed ADC for converting a high frequency analog input signal to a high frequency digital output signal, comprising in combination:
   (a) a sample and hold circuit including
      1. a first sampling MOSFET coupled between a first conductor conducting the high frequency analog input signal and a second conductor;
      2. a sampling capacitor coupled between the second conductor and a first reference voltage;
      3. a first bootstrap circuit including
         (i) a first bootstrap capacitor coupled between third and fourth conductors,
         (ii) a first MOSFET coupled between a second reference voltage and the third conductor, and a second MOSFET coupled between a third reference voltage and the fourth conductor, the first and second MOSFETs being turned on in response to pulses of a first clock signal, and
         (iii) a third MOSFET coupled between the third conductor and a gate of the first sampling MOSFET, and a fourth MOSFET coupled between the fourth conductor and the first conductor, the third and fourth MOSFETs being turned on by pulses of a second clock signal which are non-overlapping with the pulses of the first clock signal, to apply a constant gate-to-source voltage to the first sampling MOSFET, the gate-to-source voltage having a magnitude equal to the difference between the second reference voltage and the third reference voltage during the pulses of the second clock signal, the sample and hold circuit being adapted to sample a volume of the high frequency analog input signal and hold the sampled value as a DC signal; and
   (b) a conversion stage including an N-bit ADC receiving the DC signal held by the sample and hold circuit and converting the DC signal to an N-bit digital signal which constitutes one value of the high frequency digital output signal.

10. A high speed pipeline ADC for converting a high frequency analog input signal to a high frequency digital output signal, comprising in combination:
   (a) a sample and hold circuit including
      1. a first sampling MOSFET coupled between a first conductor conducting the high frequency analog input signal and a second conductor;
      2. a sampling capacitor coupled between the second conductor and a first reference voltage;
      3. a first bootstrap circuit including
         (i) a first bootstrap capacitor coupled between third and fourth conductors,
         (ii) a first MOSFET coupled between a second reference voltage and the third conductor, and a second MOSFET coupled between a third reference voltage and the fourth conductor, the first and second MOSFETs being turned on in response to pulses of a first clock signal, and
         (iii) a third MOSFET coupled between the third conductor and a gate of the first sampling MOSFET, and a fourth MOSFET coupled between the fourth conductor and the first conductor, the third and fourth MOSFETs being turned on by pulses of a second clock signal which are non-overlapping with the pulses of the first clock signal, to apply a constant gate-to-source voltage to the first sampling MOSFET, the gate-to-source voltage having a magnitude equal to the difference between the second reference voltage and the third reference voltage during the pulses of the second clock signal;
   (b) a first conversion stage including an N-bit ADC receiving a first DC signal held by the sample and hold circuit and converting it to a first N-bit digital signal, and an N-bit DAC converting the first N-bit digital signal to a second DC signal, and a summing circuit comparing the second DC signal to the first DC signal to produce a first DC error signal;
   (c) a plurality of successively coupled conversion stages each similar to the first conversion stage;
   (d) a plurality of additional sample and hold circuits each sampling a DC signal produced by a previous one of the conversion stages, respectively, and holding the sampled DC signal for conversion to a corresponding N-bit digital signal by the next one of the conversion stages; and
   (e) error correction circuitry receiving the first N-bit digital signal and the N-bit digital signals from the successively coupled conversion stages to produce the high frequency digital output signal.

11. The high speed pipeline ADC of claim 10 wherein N is equal to 2.

12. A circuit for accurately acquiring values of a high frequency analog input signal for use as an input to a utilization circuit, comprising in combination:
  (a) a sampling MOSFET coupled between a first conductor conducting the high frequency analog input signal and a second conductor, a gate of the sampling MOSFET being coupled to a third conductor;
  (b) the utilization circuit having an input conductor coupled to the second conductor for performing a predetermined signal processing operation on successive values of the analog input signal coupled by the sampling MOSFET to the second conductor;
  (c) a bootstrap circuit including
    i. a first bootstrap capacitor coupled between the third conductor and a fourth conductor;
    ii. a first MOSFET coupled between a first reference voltage and the third conductor, and a second MOSFET coupled between the fourth conductor and a second reference voltage;
    iii. a second bootstrap capacitor coupled between a fifth conductor and a sixth conductor;
    iv. a third MOSFET coupled between a third reference voltage and the fifth conductor, and a fourth MOSFET coupled between the second reference voltage and the sixth conductor; and
    v. a fifth MOSFET coupled between the fourth and fifth conductors, and a sixth MOSFET coupled between the sixth conductor and the first conductor, the gates of the first, second, third, and fourth MOSFETs being coupled to respond to a first turn-on pulse while the gates of the fifth and sixth MOSFETs respond to a second turn-on pulse to charge the first bootstrap capacitor to a first voltage and to charge the second bootstrap capacitor to a second voltage, the first, second, third, and fourth MOSFETs then being turned off and the fifth and sixth MOSFETs being turned on to couple the first and second bootstrap capacitors in series between the gate and source of the sampling MOSFET.

13. A bootstrap sample and hold circuit for accurately acquiring and holding values of a high frequency analog input signal for use as an input to a utilization circuit, comprising in combination:
  (a) a sampling MOSFET coupled between a first conductor conducting the high frequency analog input signal and a second conductor, a gate of the sampling MOSFET being coupled to a third conductor;
  (b) a sampling capacitor coupled to the second conductor and adapted to hold successive values of the analog input signal;
  (c) the utilization circuit having an input conductor coupled to the second conductor for performing a predetermined signal processing operation on the successive values of the analog input signal held on the sampling capacitor;
  (d) a bootstrap circuit including
    i. a first bootstrap capacitor coupled between the third conductor and a fourth conductor;
    ii. a first MOSFET coupled between a first reference voltage and the third conductor, and a second MOSFET coupled between the fourth conductor and a second reference voltage;
    iii. a second bootstrap capacitor coupled between a fifth conductor and a sixth conductor;
    iv. a third MOSFET coupled between a third reference voltage and the fifth conductor, and a fourth MOSFET coupled between the second reference voltage and the sixth conductor;
    v. a fifth MOSFET coupled between the fourth and fifth conductors, and a sixth MOSFET coupled between the sixth conductor and the first conductor, the gates of the first, second, third, and fourth MOSFETs being coupled to respond to a first turn-on pulse while the gates of the fifth and sixth MOSFETs respond to a second turn-on pulse to charge the first bootstrap capacitor to a first voltage and to charge the second bootstrap capacitor to a second voltage, the first, second, third, and fourth MOSFETs then being turned off and the fifth and sixth MOSFETs being turned on to couple the first and second bootstrap capacitors in series between the gate and source of the sampling MOSFET.

14. The bootstrap sample and hold circuit of claim 13 wherein the sampling MOSFET and the first through the sixth MOSFETs are N-channel MOSFETs, and further including a P-channel seventh MOSFET coupled between the fourth and fifth conductors and a P-channel eighth MOSFET coupled between the sixth and first conductors, the gates of the seventh and eighth MOSFETs receiving a signal which is the logical complement of the signal received by the gate of the fifth and sixth MOSFETs.

15. The bootstrap sample and hold circuit of claim 13 wherein the third reference voltage is substantially greater than the first reference voltage.

16. The bootstrap sample and hold circuit of claim 13 wherein the capacitance of the first bootstrap capacitor is substantially different than the capacitance of the second bootstrap capacitance.

17. A high speed ADC for converting a high frequency analog input signal to a high frequency digital output signal, comprising in combination:
  (a) a sample and hold circuit including
    a bootstrap sample and hold circuit for accurately acquiring and holding values of the high frequency analog input signal for use by a utilization circuit, including
      i. a sampling MOSFET coupled between a first conductor conducting the high frequency analog input signal and a second conductor, a gate of the sampling MOSFET being coupled to a third conductor,
      ii. a sampling capacitor coupled to the second conductor and adapted to hold successive values of the analog input signal,
      iii. the utilization circuit having an input conductor coupled to the second conductor for performing a predetermined signal processing operation on the successive values of the analog input signal held on the sampling capacitor,
      iv. a bootstrap circuit including
        (1) a first bootstrap capacitor coupled between the third conductor and a fourth conductor,
        (2) a first MOSFET coupled between a first reference voltage and the third conductor, and a second MOSFET coupled between the fourth conductor and a second reference voltage,
        (3) a second bootstrap capacitor coupled between a fifth conductor and a sixth conductor,
        (4) a third MOSFET coupled between a third reference voltage and the fifth conductor, and a fourth MOSFET coupled between the second reference voltage and the sixth conductor,
        (5) a fifth MOSFET coupled between the fourth and fifth conductors, and a sixth MOSFET coupled between the sixth conductor and the first conductor, the gates of the first, second, third, and fourth MOSFETs being coupled to respond to a first turn-on pulse while the gates of the fifth and sixth MOSFETs respond to a second turn-on pulse to charge the first bootstrap capacitor to a first voltage and to charge the second bootstrap capacitor to a second voltage, the first, second, third, and fourth MOSFETs then being turned off and the fifth and sixth MOSFETs being turned on to couple the first and second bootstrap capacitors in series between the gate and source of the sampling MOSFET; and (b) a conversion stage including an N-bit ADC receiving a DC signal held by the bootstrap sample and hold circuit and converting it to an N-bit digital signal which constitutes one value of the high frequency digital output signal.

18. A high speed pipeline ADC for converting a high frequency analog input signal to a high frequency digital output signal, comprising in combination:

(a) a sample and hold circuit including
a bootstrap sample and hold circuit for accurately acquiring and holding values of the high frequency analog input signal for use by a utilization circuit, including
i. a sampling MOSFET coupled between a first conductor conducting the high frequency analog input signal and a second conductor, a gate of the sampling MOSFET being coupled to a third conductor,
ii. a sampling capacitor coupled to the second conductor and adapted to hold successive values of the high frequency analog input signal,
iii. the utilization circuit having an input conductor coupled to the second conductor for performing a predetermined signal processing operation on the successive values of the analog input signal held on the sampling capacitor,
iv. a bootstrap circuit including
  (1) a first bootstrap capacitor coupled between the third conductor and a fourth conductor,
  (2) a first MOSFET coupled between a first reference voltage and the third conductor, and a second MOSFET coupled between the fourth conductor and a second reference voltage,
  (3) a second bootstrap capacitor coupled between a fifth conductor and a sixth conductor,
  (4) a third MOSFET coupled between a third reference voltage and the fifth conductor, and a fourth MOSFET coupled between the second reference voltage and the sixth conductor,
  (5) a fifth MOSFET coupled between the fourth and fifth conductors, and a sixth MOSFET coupled between the sixth conductor and the first conductor, the gates of the first, second, third, and fourth MOSFETs being coupled to respond to a first turn-on pulse while the gates of the fifth and sixth MOSFETs respond to a second turn-on pulse to charge the first bootstrap capacitor to a first voltage and to charge the second bootstrap capacitor to a second voltage, the first, second, third, and fourth MOSFETs then being turned off and the fifth and sixth MOSFETs being turned on to couple the first and second bootstrap capacitors in series between the gate and source of the sampling MOSFET; and (b) a first conversion stage including an N-bit ADC receiving a first DC signal held by the sample and hold circuit and converting it to an N-bit digital signal, and an N-bit DAC converting the N-bit digital signal to a second DC signal, and a summing circuit comparing the second DC signal to the first DC signal to produce a DC error signal;

(c) a plurality of successively coupled conversion stages each similar to the first conversion stage;

(d) a plurality of additional sample and hold circuits each sampling a DC signal produced by a previous one of the conversion stages, respectively, and holding the sampled DC signal for conversion to a corresponding N-bit digital signal by the next one of the conversion stages; and (e) error correction circuitry receiving the first N-bit digital signal and the N-bit digital signals from the successively coupled conversion stages to produce the high frequency digital output signal.

19. The high speed pipeline ADC of claim 18 wherein N is equal to 2.

20. A method of providing a linear channel resistance in a first sampling MOSFET that is switched on and off to repeatedly sample a high frequency analog signal, comprising the steps of:

(a) applying the high frequency analog signal to a source of the first sampling MOSFET, a first bootstrap capacitor being switchably coupled to the first sampling MOSFET;

(b) operatively decoupling the first bootstrap capacitor from the first sampling MOSFET and then operatively coupling the first bootstrap capacitor between first and second reference voltage conductors to charge the first bootstrap capacitor to a first voltage; and (c) operatively decoupling the first bootstrap capacitor from the first and second reference voltage conductors and then operatively coupling the first bootstrap capacitor between a gate and the source of the first sampling MOSFET to apply the first voltage between the gate and source of the first sampling MOSFET, the gate-to-source voltage of the first sampling MOSFET having a constant value equal to the first voltage as the voltage of high frequency analog signal varies, to thereby cause the channel resistance to be nearly constant despite voltage changes of the high frequency analog signal.

21. The method of claim 20 including repeating steps (b) and (c) at a predetermined sampling rate that is substantially higher than the frequency of the analog signal.

22. A method of providing a linear channel resistance in a first sampling MOSFET that is switched on and off to repeatedly sample a high frequency analog signal, comprising the steps of:

(a) applying the high frequency analog signal to a source of the first sampling MOSFET, first and second bootstrap capacitors being switchably coupled to the first sampling MOSFET;

(b) operatively decoupling the first and second bootstrap capacitors from the first sampling MOSFET and then
  i. operatively coupling the first bootstrap capacitor between first and second reference voltage conductors to charge the first bootstrap capacitor to a first voltage;
  ii. operatively coupling the second bootstrap capacitor between third and fourth reference voltage conductors to charge the second bootstrap capacitor to a second voltage;

(c) operatively decoupling the first bootstrap capacitor from the first and second reference voltage conductors and operatively decoupling the second bootstrap capacitor from the third and fourth reference voltage conductors, and then operatively coupling the first bootstrap capacitor and second bootstrap capacitor in series between a gate and the source of the first sampling MOSFET to apply a boost voltage between the gate and source of the first sampling MOSFET, the gate-to-source voltage of the first sampling MOSFET having a constant value equal to the boost voltage as the voltage of high frequency analog signal varies, to thereby cause the channel resistance to be nearly constant despite voltage changes of the high frequency analog signal, the boost voltage representing a summation of the first and second voltages according to the capacitances of the first and second bootstrap capacitors.

23. The method of claim 22 wherein the boost voltage is given by the equation $$V_{BOOST}=V_{CS1}+V_{CS2}=V1+V2,$$

wherein CS1 and CS2 are the capacitances of the first and second bootstrap capacitors, respectively, and V1 and V2 are the first and second voltages, respectively.

* * * * *